(12) United States Patent
Wu

(10) Patent No.: US 8,030,778 B2
(45) Date of Patent: Oct. 4, 2011

(54) INTEGRATED CIRCUIT STRUCTURE AND MANUFACTURING METHOD THEREOF

(75) Inventor: Ping-Chang Wu, Hsinchu County (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 453 days.

(21) Appl. No.: 11/774,388

(22) Filed: Jul. 6, 2007

(65) Prior Publication Data

US 2009/0008782 A1 Jan. 8, 2009

(51) Int. Cl.
*H01L 23/52* (2006.01)
*H01L 21/4763* (2006.01)

(52) U.S. Cl. . 257/773; 257/760; 257/774; 257/E23.141; 257/E21.495; 438/622; 438/624

(58) Field of Classification Search .......... 257/760, 257/E21.495, E23.141, 773, 774; 438/622, 438/624
See application file for complete search history.

(56) References Cited

U.S. PATENT DOCUMENTS

| 5,309,025 | A | * | 5/1994 | Bryant et al. | 257/784 |
| 5,736,791 | A | * | 4/1998 | Fujiki et al. | 257/781 |
| 2001/0036740 | A1 | * | 11/2001 | Shields et al. | 438/710 |
| 2003/0001241 | A1 | * | 1/2003 | Chakrabarti et al. | 257/643 |
| 2005/0112957 | A1 | * | 5/2005 | Yang et al. | 439/758 |
| 2005/0186782 | A1 | * | 8/2005 | Burke et al. | 438/638 |
| 2005/0275110 | A1 | * | 12/2005 | Maekawa et al. | 257/760 |
| 2006/0081986 | A1 | * | 4/2006 | Clevenger et al. | 257/751 |
| 2006/0088975 | A1 | * | 4/2006 | Ueda | 438/421 |
| 2007/0032062 | A1 | * | 2/2007 | Lee et al. | 438/597 |
| 2007/0077761 | A1 | * | 4/2007 | Lehr et al. | 438/687 |
| 2007/0085211 | A1 | * | 4/2007 | Hamada | 257/758 |
| 2008/0067680 | A1 | * | 3/2008 | Sakai et al. | 257/751 |

FOREIGN PATENT DOCUMENTS

| TW | 469591 | 12/2001 |
| TW | 200527593 | 8/2005 |

OTHER PUBLICATIONS

Wu, "Integrated Circuit Structure and Manufacturing Method Thereof", Invention disclosure, Apr. 3, 2006.

* cited by examiner

*Primary Examiner* — Eugene Lee
*Assistant Examiner* — Peniel M Gumedzoe
(74) *Attorney, Agent, or Firm* — Winston Hsu; Scott Margo

(57) ABSTRACT

An integrated circuit structure is provided. The integrated circuit structure includes a dielectric layer, a conductive structure, a low-k dielectric layer and a plug. The conductive structure is disposed in the dielectric layer, having a recess portion. The low-k dielectric layer is disposed on the dielectric layer. The plug is disposed in the low-k dielectric layer and has a protruding bonding portion on the bottom of the plug. The bonding portion is extended into the dielectric layer and connected to the recess portion of the conductive structure.

17 Claims, 9 Drawing Sheets

INTEGRATED CIRCUIT STRUCTURE AND MANUFACTURING METHOD THEREOF

BACKGROUND OF THE INVENTION

1. Field of the Invention

The present invention generally relates to an integrated circuit structure and a manufacturing method thereof, more particularly, to an interconnect-related integrated circuit structure and manufacturing method thereof.

2. Description of Related Art

In deep sub-micro integrated circuit technology, high-speed, multi-function, highly integrated, low power consumption and low cost ultra large scale integrated circuit chips are mass-produced as a result of the continuous reduction of device line width. Because of the miniaturization and the increase in the integration of devices, the density of interconnects also increases and leads to a jump in the resistance/capacitance (RC) of the devices. As a result, signal transmission or RC delay is increasingly important and the operating efficiency of the devices is lowered correspondingly.

To limit the effect caused by RC delay, low-k inter-layer dielectric layers are formed between the layers of multi-layer interconnects so as to reduce the parasitic capacitance between conductive wires, and the conductive wires are made of copper instead of aluminum so as to reduce electrical resistance. Therefore, the operating speed and performance of the device is enhanced.

However, the adhesion of a low-k dielectric layer and a silicon oxide dielectric layer is poor and the serious effect caused by dielectric peeling leads to the drop of particles and the bridging between metals from the subsequently copper interconnect process. Therefore, the probability of resulting in a short circuit between some of the copper wires is increased and the process yield can be adversely affected. In particular, when a larger stress is applied to a thermal stress test of a flip-chip package, dielectric peeling is easily induced so that the reliability of the device can be substantially reduced.

SUMMARY OF THE INVENTION

Accordingly, the present invention is directed to an integrated circuit structure that uses a protruding bonding portion at the bottom of a plug to connect with a conductive structure so as to enhance adhesion between a dielectric layer and a low dielectric constant dielectric layer and minimize peeling of the dielectric layer.

The present invention is directed to a method of manufacturing an integrated circuit structure that uses a conductive structure with a recess portion to fabricate a bonding portion to connect with the conductive structure in a process of forming a plug so as to increase adhesion between a dielectric layer and a low dielectric constant dielectric layer.

According to an embodiment of the present invention, an integrated circuit structure is provided. The integrated circuit structure includes a dielectric layer, a conductive structure, a low-k dielectric layer and a plug. The conductive structure is disposed in the dielectric layer, having a recess portion. The low-k dielectric layer is disposed on the dielectric layer. The plug is disposed in the low-k dielectric layer and has a protruding bonding portion on the bottom of the plug. The bonding portion is extended into the dielectric layer and connected to the recess portion of the conductive structure.

In an embodiment of the present invention, the lateral dimension of the plug is greater than the lateral dimension of the recess portion.

In an embodiment of the present invention, the bonding portion of the plug is extended into the recess portion of the conductive structure.

In an embodiment of the present invention, the conductive structure is a ring-like structure and the recess portion extends through the conductive structure to form a hollow portion.

In an embodiment of the present invention, the lateral dimension of the plug is greater than the lateral dimension of the hollow portion.

In an embodiment of the present invention, the material of the plug includes copper, tungsten or an alloy of the two.

In an embodiment of the present invention, the material of the conductive structure includes copper, aluminum or an alloy of the two.

In an embodiment of the present invention, an insulation layer is disposed between the dielectric layer and the low-k dielectric layer.

In an embodiment of the present invention, the plug is part of a dual damascene structure.

The present invention also provides a method of manufacturing an integrated circuit structure. The method includes providing a dielectric layer and forming a conductive structure in the dielectric layer, wherein the conductive structure has a recess portion. Next, a low-k dielectric layer is formed on the dielectric layer. Thereafter, an opening is formed in the low-k dielectric layer. The opening communicates with the recess portion of the conductive structure so as to expose part of the conductive structure. After that, a plug is formed in the opening. A bonding portion on the bottom of the plug is extended into the recess portion and connected to the conductive structure.

In an embodiment of the present invention, the lateral dimension of the plug is greater than the lateral dimension of the recess portion.

In an embodiment of the present invention, the bonding portion of the plug is extended into the recess portion of the conductive structure.

In an embodiment of the present invention, the conductive structure is a ring-like structure and the recess portion extends through the conductive structure to form a hollow portion.

In an embodiment of the present invention, the method of forming the conductive structure includes forming a patterned photoresist layer on the dielectric layer and using the patterned photoresist layer as a mask to form a ring-like opening. Thereafter, the patterned photoresist layer is removed and the ring-like opening is filled using a conductive material.

In an embodiment of the present invention, the conductive material includes copper or an alloy of copper.

In an embodiment of the present invention, the method of forming the conductive structure includes forming a conductive layer in the dielectric layer and removing part of the conductive layer so as to form a recess portion on the surface of the conductive layer.

In an embodiment of the present invention, the method of manufacturing the integrated circuit further includes forming an insulation layer on the dielectric layer after forming the conductive structure but before forming the low-k dielectric layer.

In an embodiment of the present invention, the method of forming the low-k dielectric layer includes performing a spin-coating process.

In the present invention, a protruding bonding portion is formed on the bottom of the plug. Therefore, the plug can create a tight connection with the conductive structure below and reinforce the adhesion between the dielectric layer and the low-k dielectric layer. As a result, the probability of dielectric peeling is reduced and the performance and product yield of the device is increased.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
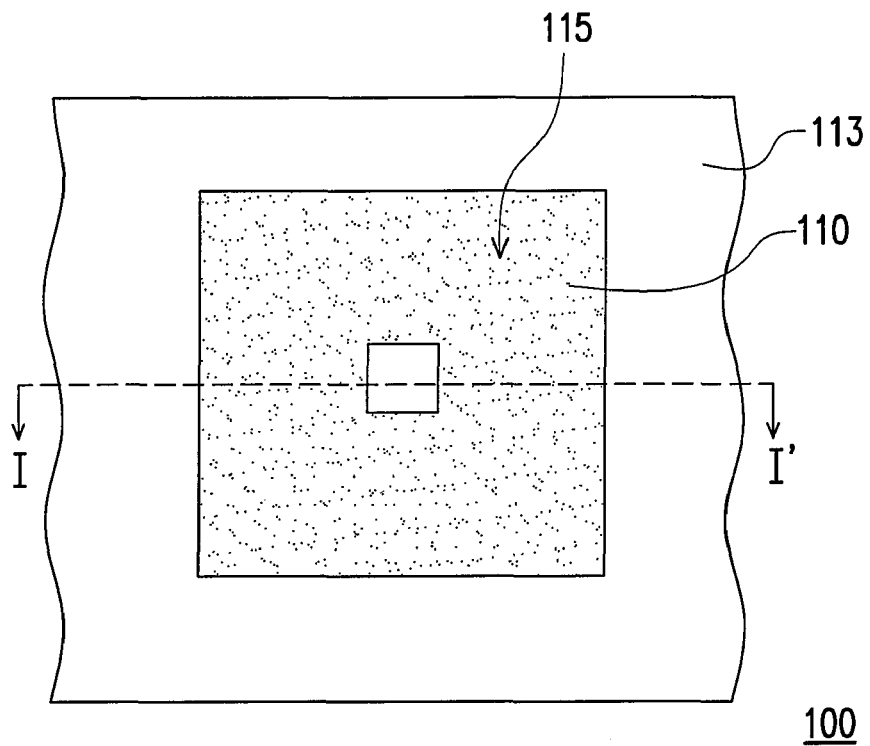
FIGS. 1A to 1E are top views showing a process of manufacturing an integrated circuit structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1E are top views showing a process of manufacturing an integrated circuit structure according to an embodiment of the present invention. FIGS. 2A to 2E are schematic cross-sectional views along line I-I' of FIGS. 1A to 1E showing the process of manufacturing an integrated circuit structure.

Figure 2A:
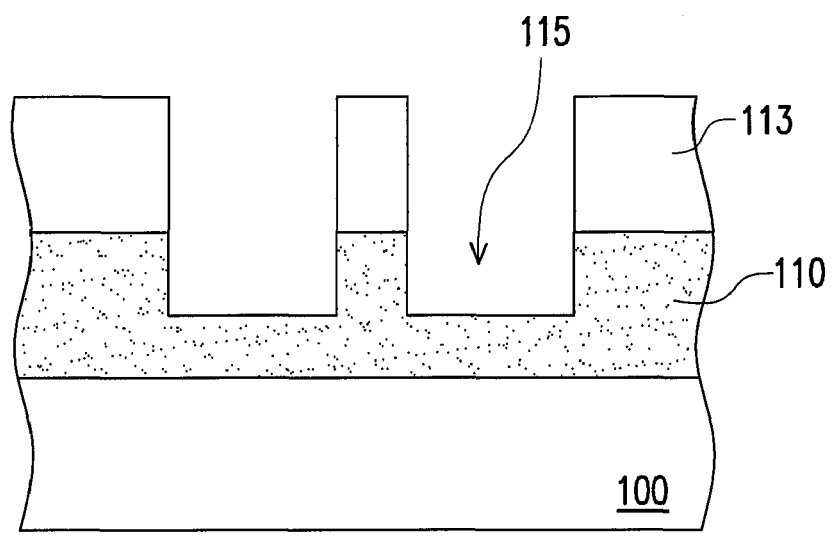
FIGS. 2A to 2E are schematic cross-sectional views along line I-I' of FIGS. 1A to 1E showing the process of manufacturing an integrated circuit structure.

As shown in FIGS. 1A and 2A, the present invention provides a method of manufacturing an integrated circuit structure. The method includes providing a dielectric layer 110. The dielectric layer 110 is fabricated using a dielectric material such as silicon oxide, borophosphosilicate glass (BPSG), phosphosilicate glass (PSG) or borosilicate glass (BSG) and formed by performing a chemical vapor deposition process, for example. A conductive part (not shown) is already formed in the dielectric layer 110, for example. The dielectric layer 110 is disposed on a substrate 100 and the substrate 100 is a semiconductor wafer, for example. The substrate 100 includes devices and films that are formed on the semiconductor wafer. Furthermore, the substrate 100 may has a conductive part (not shown) already formed therein. A subsequently formed conductive structure and plug are electrically connected to the conductive part of the dielectric layer 110 or the substrate 100 in order to form a complete circuit.

Next, a conductive structure 120 is formed in the dielectric layer 110. The conductive structure 120 has a recess portion 125 (refer to FIGS. 1B and 2B). In the present embodiment, the conductive structure 120 can be a ring-like structure. The method of forming the conductive structure 120 includes, as shown in FIG. 2A, forming a patterned photoresist layer 113 on the dielectric layer 110. Then, using the patterned photoresist layer 113 as a mask, a portion of the dielectric layer 110 is removed to form a ring-like opening 115 (as shown in FIG. 1A). The patterned photoresist layer 113 can be a positive photoresist and the method of forming the patterned photoresist layer 113 may involves forming a photoresist material layer (not shown) on the dielectric layer 110 by spin-coating.

Then, the photoresist material layer is exposed and developed to form the patterned photoresist layer 113. The method of removing a portion of the dielectric layer 110 includes, for example, performing a dry etching operation such as a reactive ion etching process.

Figure 1B:
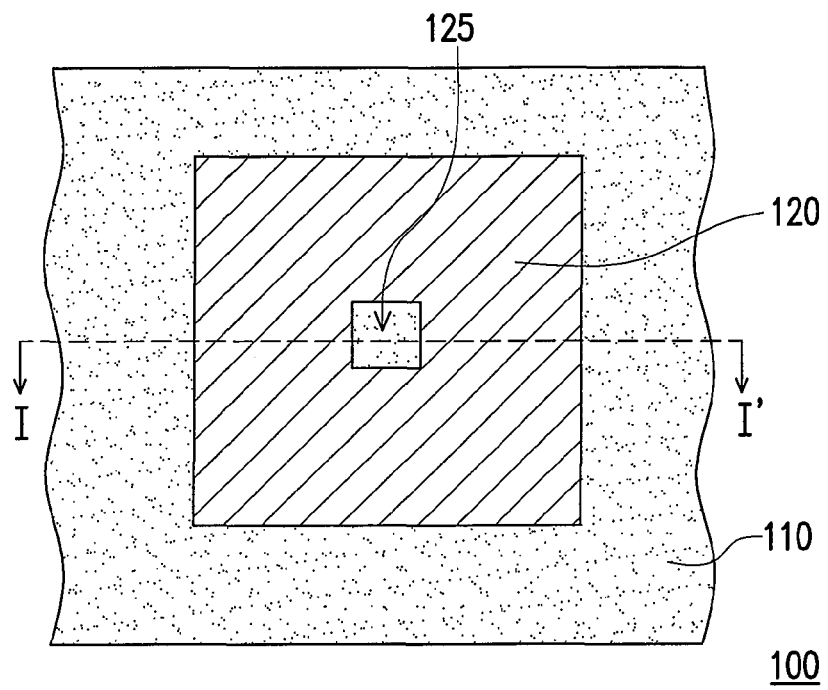
Figure 1B:
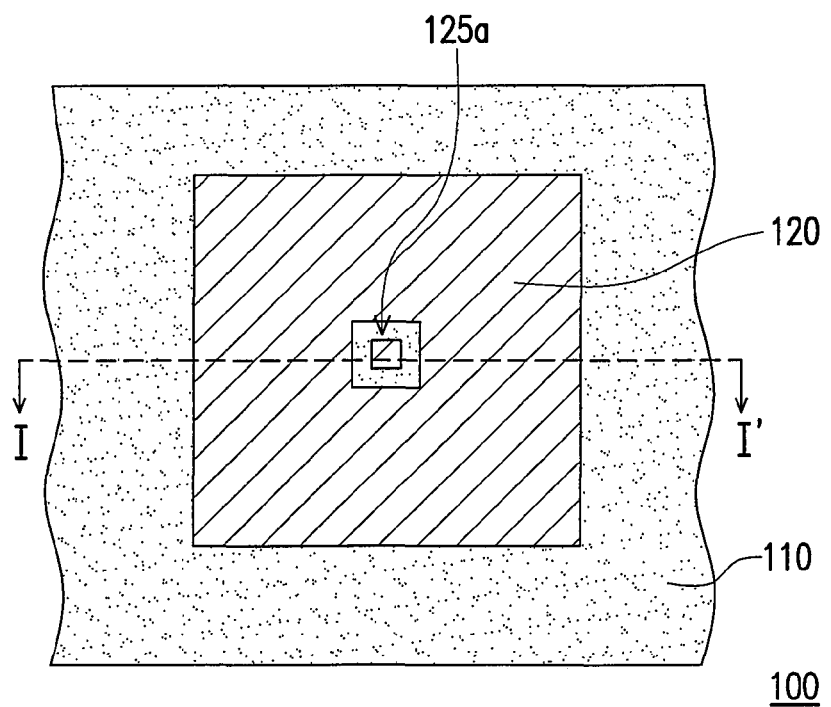
Figure 2B:
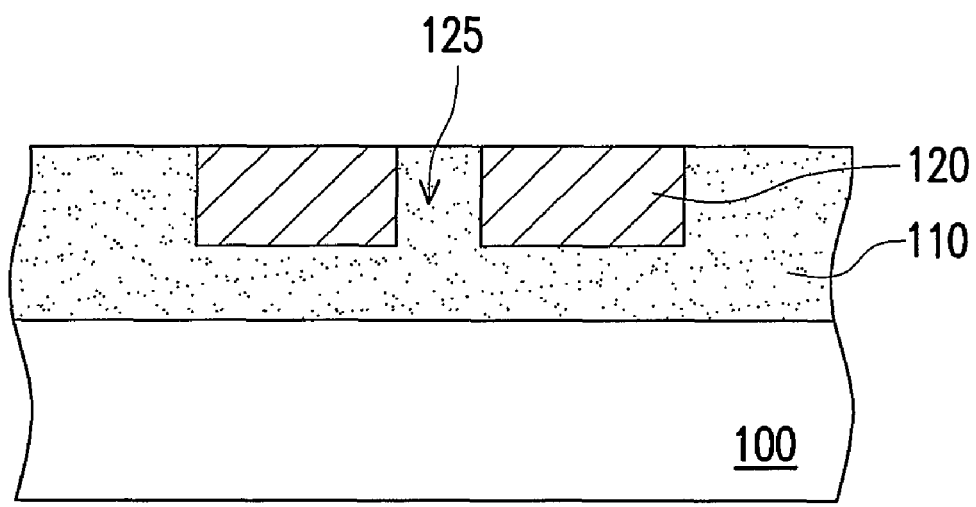
Figure 2B:
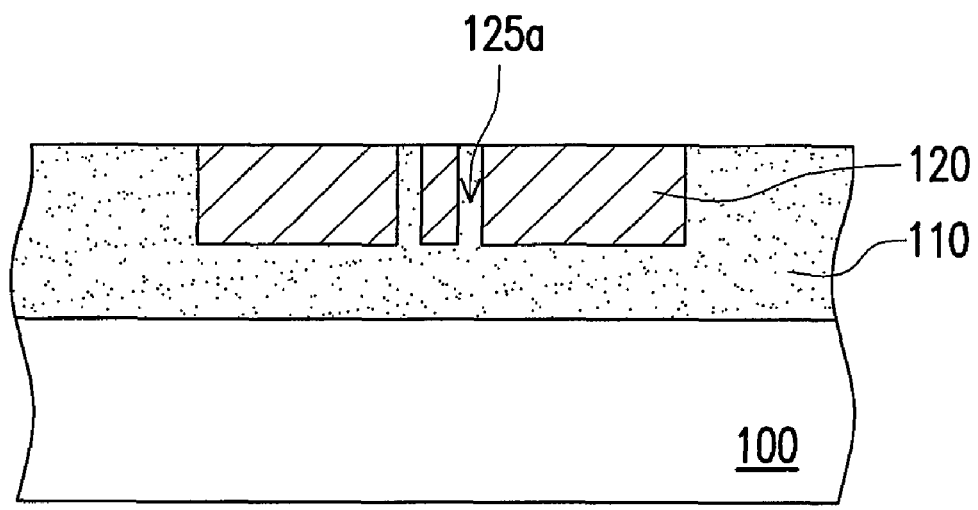

As shown in FIGS. 1B and 2B, the patterned photoresist layer 113 is removed and the ring-like opening 115 is filled with a conductive material to form a conductive structure 120. The method of forming the conductive structure 120 includes, for example, performing a chemical vapor deposition process or a physical vapor deposition process to form a conformal conductive material layer (not shown) on the dielectric layer 110 and in the ring-like opening 115. Thereafter, a planarization process is performed to remove the conductive material on the dielectric layer 110 so that only the conductive material in the ring-like opening 115 is retained. The conductive material is, for example, copper, aluminum, tungsten, silver or an alloy formed by any combination of the foregoing metals. The planarization method for removing the conductive material on the dielectric layer 110 includes a chemical-mechanical polishing operation, for example.

As shown in FIG. 1B, the conductive structure 120 is a ring-like structure with a recess portion 125 in the middle. In the present embodiment, the recess portion 125, for example, extends through the conductive structure 120 to form a hollow portion surrounded by the conductive structure 120. In another embodiment of the present invention, the recess portion 125a as shown in FIGS. 1B' and 2B' can be a ring-like hollow portion by using the design of the photolithography and etching process, i.e., the recess portion 125a is disposed to surround a portion of the conductive structure 120. The ring-like recess portion 125a may be adopted for the following steps of the present invention; therefore, only the recess portion 125 shown in the FIGS. 1B and 2B is presented as an exemplary example hereinafter.

Of course, the recess 125 is not limited to the hollow type shown in FIGS. 1B and 1B', the recess 125 can be any other type as long as the conductive structure 120 has a convey where the subsequently formed plug can plug in. It should be noted that the conductive structure 120 in FIG. 1B is a rectangular ring-like structure. However, the ring-like structure is not limited to a rectangular shape. Other types of geometric patterns such as circular, elliptical, triangular, diamond or polygonal shape can be used in the present invention as well. Moreover, the recess portion 125 of the ring-like structure may have a pattern that differs from the external profile pattern of the conductive structure 120. For example, even if the recess portion 125 is rectangular, the external profile of the conductive structure 120 can be circular or other pattern. In general, the pattern of the conductive structure 120 is designed according to the disposition and dimension of surrounding devices and the requirements of the process.

Figure 1C:
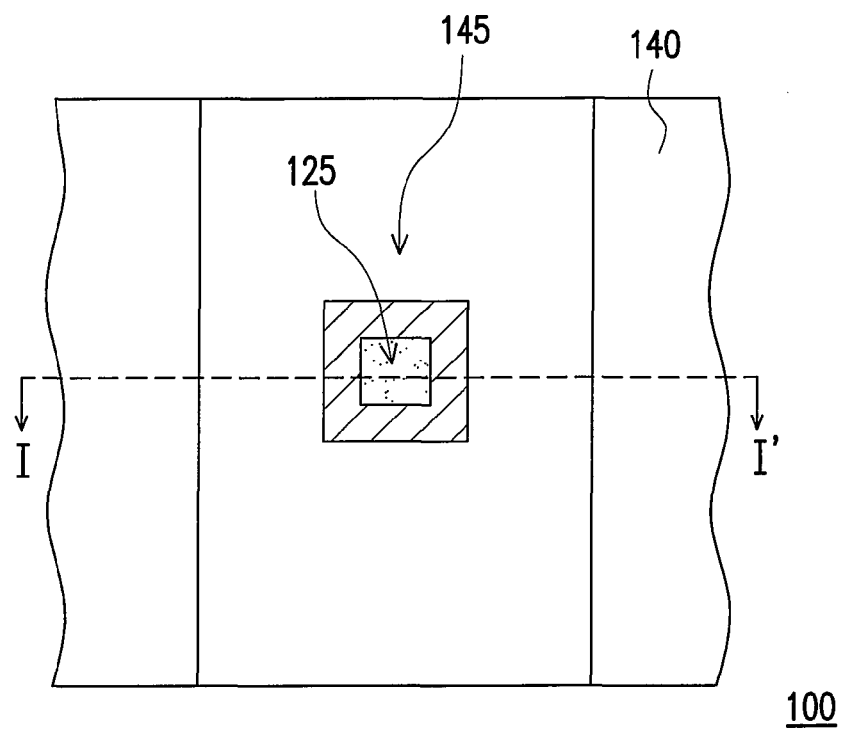
Figure 2C:
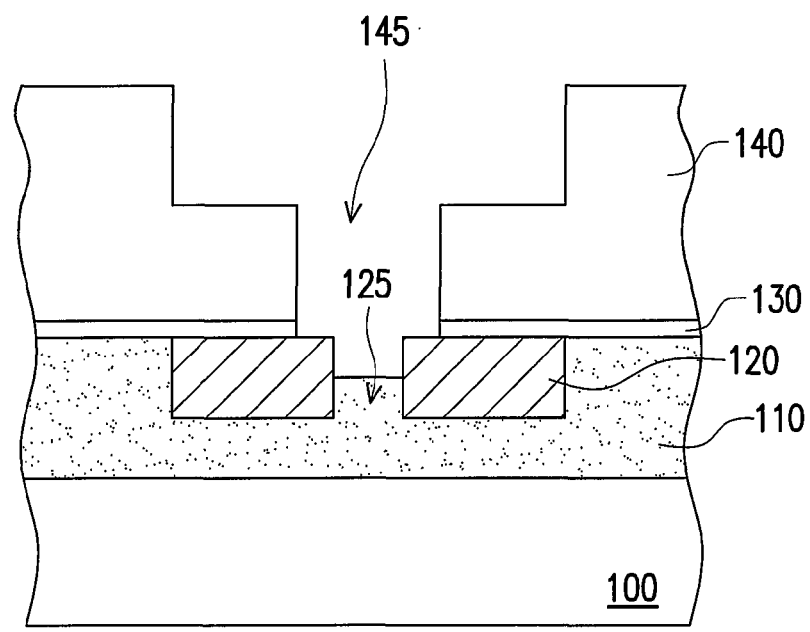

Thereafter, as shown in FIGS. 1C and 2C, an insulation layer 130 can be selectively formed on the dielectric layer 110 and the conductive structure 120. The material of the insulation layer 130 includes silicon oxide and is formed by performing a chemical vapor deposition process, for example. Later on, a low-k dielectric layer 140 is formed on the insulation layer 130. The material of the low-k dielectric layer 140 includes various dielectric materials having a dielectric constant smaller than 4, for example, carbon doped oxide (CDO) with porogen (main ingredient being $C_xH_y$, for example), hydrogenated amorphous carbon, fluorinated amorphous carbon, Parylene AF4, HSQ, PAE, Cyclotene, Silica aerogel, Silica xerogel, Flare, SILK, Parylene and so on. The method of forming the low-k dielectric layer includes performing a chemical vapor deposition process or a spin-coating operation.

Next, an opening 145 is formed in the low-k dielectric layer 140 and the insulation layer 130. The opening 145 extends into the recess portion 125 of the conductive structure 120 and exposes part of the conductive structure 120. The method of forming the opening 145 includes, for example, removing a portion of the low-k dielectric layer 140 and the insulation layer 130 by performing a dry etching operation or a wet etching operation. Additionally, an over-etching process is performed to remove a portion of the dielectric layer 110 in the recess portion 125 to expose part of the sidewalls of the conductive structure 120. In the present embodiment, the opening 145 is, for example, a dual damascene opening with an upper portion of the opening 145 being a trench and a lower portion of the opening 145 being a plug opening.

Figure 1D:
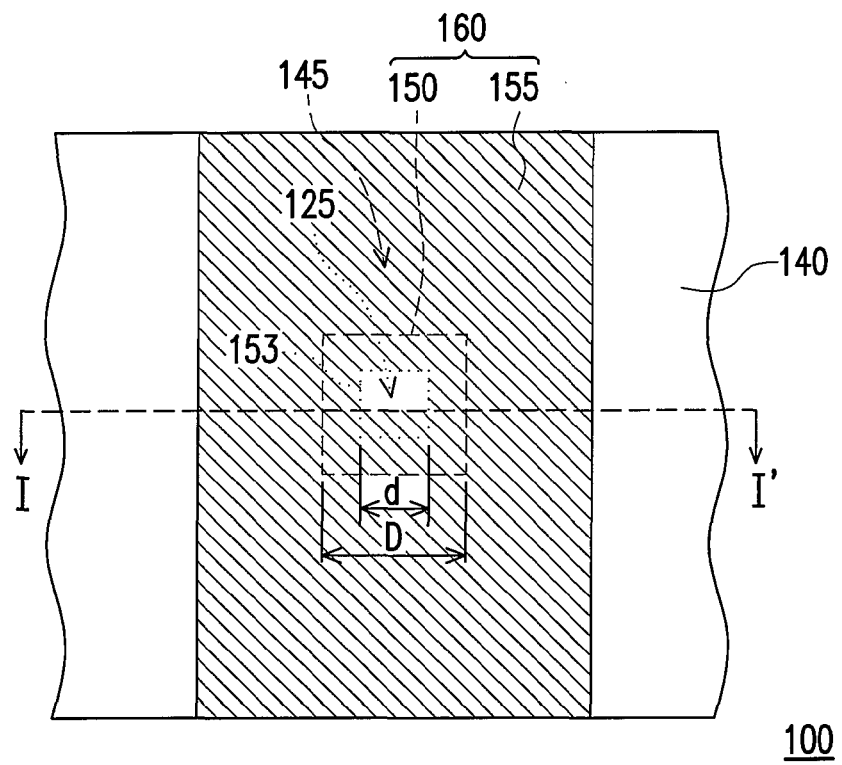
Figure 2D:
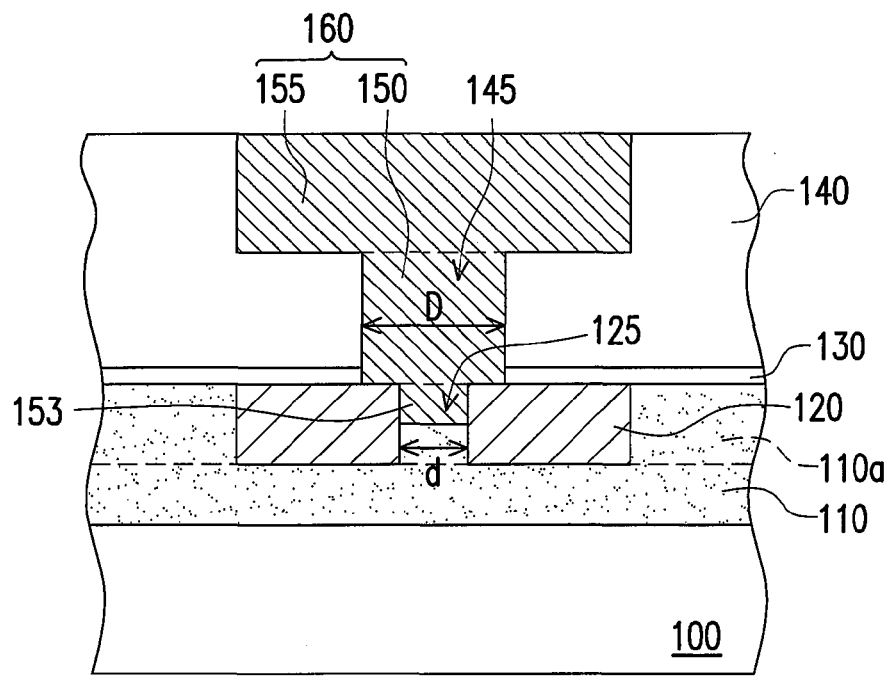

Thereafter, as shown in FIGS. 1D and 2D, a dual damascene structure 160 having a plug 150 and a conductive wire 155 is formed in the opening 145. The bottom of the plug 150 has a bonding portion 153. The bonding portion 153 is extended into the recess portion 125 and connected to the conductive structure 120. The method of forming the plug 150 and the conductive wire 155 of the dual damascene structure 160 includes, for example, forming a conformal conductive material layer (not shown) to cover the whole low-k dielectric layer 140. And a chemical-mechanical polishing operation is performed to remove the conductive material layer outside the opening 140 so as to form the dual damascene structure 160 with a flat surface. The material of the conductive includes copper, aluminum or an alloy containing copper or aluminum. The method of forming the conductive material layer includes, for example, performing a chemical vapor deposition process or a physical vapor deposition process. Furthermore, an adhesive layer or a barrier layer (not shown) can be formed on the inner sidewalls of the opening 140 before forming the conductive material layer. The material of the adhesive layer or barrier layer is titanium, titanium nitride, titanium/titanium nitride, tungsten nitride, tantalum/tantalum nitride and so on, for example.

In one embodiment, the lateral dimension D of the plug 150 is greater than the lateral dimension of the recess portion 125. The protruding bonding portion 153 on the bottom of the plug 150 is extended into the recess portion 125. In other words, the entire outer sidewall of the bonding portion 153 is connected to the sidewall of the recess portion 125 of the conductive structure 120 so as to substantially increase the bonding strength between the plug 150 and the conductive structure 120. Therefore, the adhesion between the insulation layer 130 and the low-k dielectric layer 140 above the conductive structure 120 is also increased so that dielectric peeling is effectively minimized. When the dielectric layer is prevented from peeling, the probability of resulting in a short circuit due to bridging between conductive wires is reduced. Consequently, not only is the reliability and product yield of the device increased, but overall performance of the device is also improved.

Referring to FIG. 1D, in another embodiment, except using the dielectric material like silicon oxide mentioned above as the material of the dielectric layer 110, in general, the material of the upper portion of the dielectric layer 110 can be a dielectric layer 110a composed of low-k dielectric material for reducing the resistance of the interconnect. The material of the dielectric layer 110a is, for example, carbon doped oxide (CDO), hydrogenated amorphous carbon, fluorinated amorphous carbon, Parylene AF4, HSQ, PAE, Cyclotene, Silica aerogel, Silica xerogel, Flare, SILK, Parylene and so on. The method of forming the dielectric layer 110a includes performing a chemical vapor deposition process or a spin-coating operation. Besides, the dielectric layer 110a can be formed after the conductive structure 120 has already formed. In this embodiment, the material above and below the insulator layer 130 are both low-k dielectric material, hence, the adhesion between these dielectric layer can be highly enhanced by applying the conductive structure 120 in the embodiment, so as to improve the reliability and product yield of the device.

Figure 1E:
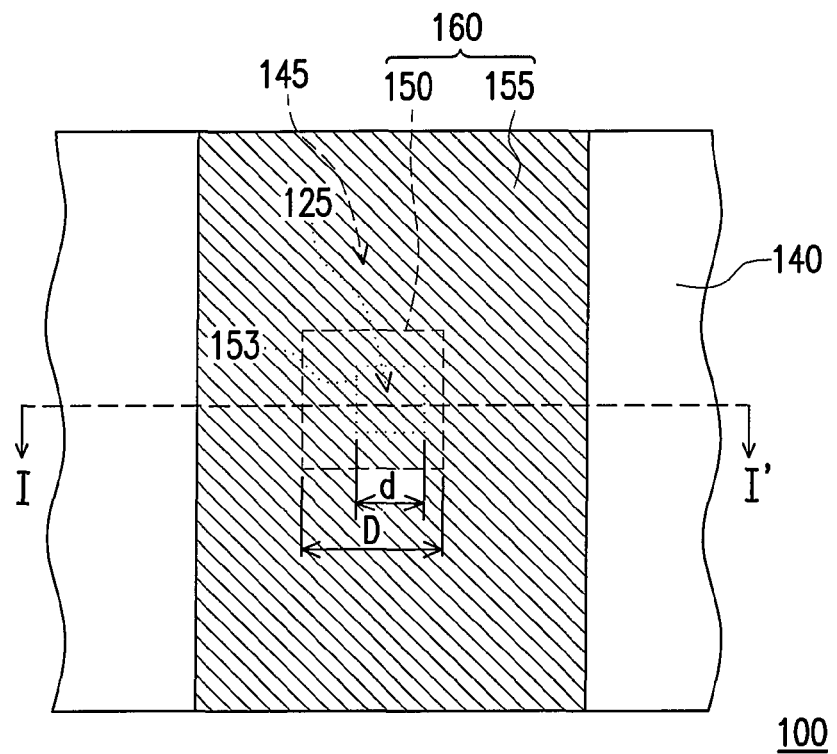
Figure 2E:
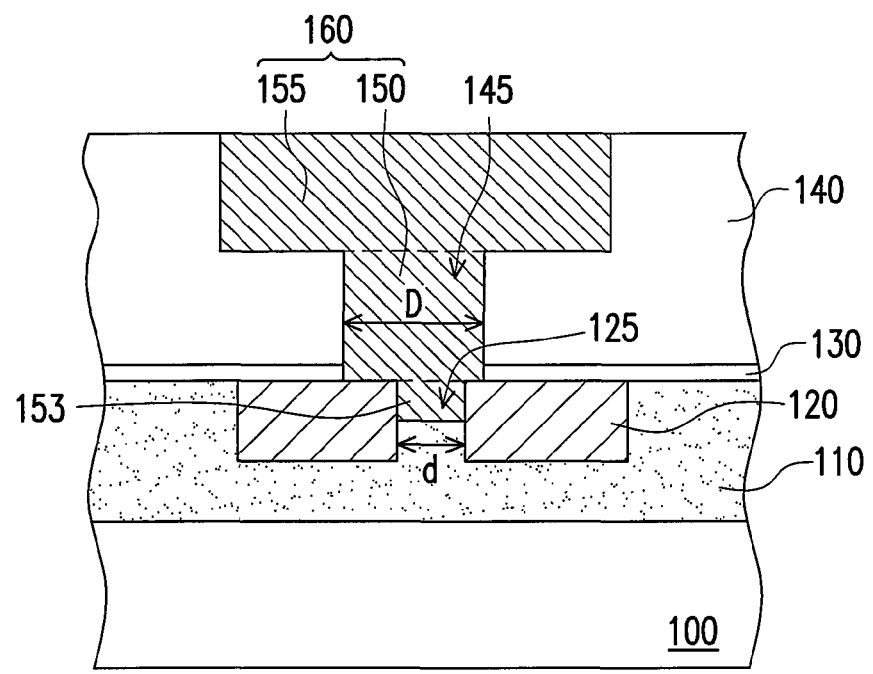

In addition, the lateral dimension D of the plug 150 is greater than the lateral dimension d of the recess portion 125. Therefore, even if there is some misalignment in the photolithographic and etching process of the opening 145 so that the plug 150 is offset to the left as shown in FIGS. 1E and 2E, the bonding portion 153 on the bottom of the plug 150 can still be correctly extended into the recess portion 125. In one embodiment, even if the misalignment of the plug 150 is too large or the lateral dimension of the plug 150 is smaller than or equal to the recess portion 125 so that the bonding portion 153 cannot be entirely extended within the inner rim (the recess portion 125) sidewall of the conductive structure 120, the adhesion between the low-k dielectric layer 140 and the insulation layer 130 can still be increased so as to achieve the same function as long as the bonding portion 153 is connected to part of the conductive structure 120.

In the foregoing embodiment, a ring-like conductive structure is used as an example. However, the integrated circuit structure provided in the present invention is not limited to using a ring-like conductive structure. FIGS. 3A to 3D are schematic cross-sectional views showing a process of manufacturing an integrated circuit structure according to another embodiment of the present invention. The main differences between the present embodiment and the previous embodiment are in the shape of the conductive structure and the manufacturing method. In FIGS. 3A to 3D, FIGS. 1A to 1E and FIGS. 2A to 2E, identical components are correspondingly labeled and a detail description of the identical components is omitted. Furthermore, one may refer to FIGS. 1A to 1E of the previous embodiment for the top views of the present embodiment so that a detailed description is not repeated here.

Figure 3A:
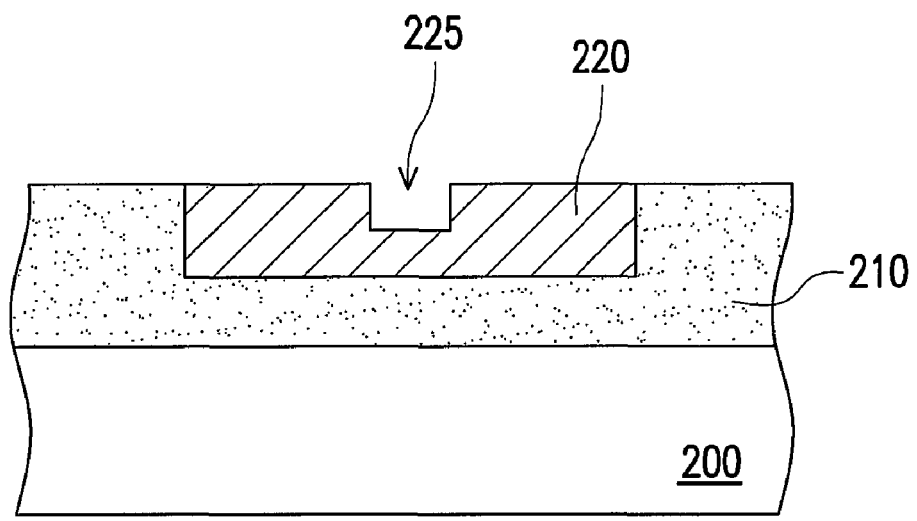
FIGS. 3A to 3D are schematic cross-sectional views showing a process of manufacturing an integrated circuit structure according to another embodiment of the present invention.
Figure 3A:
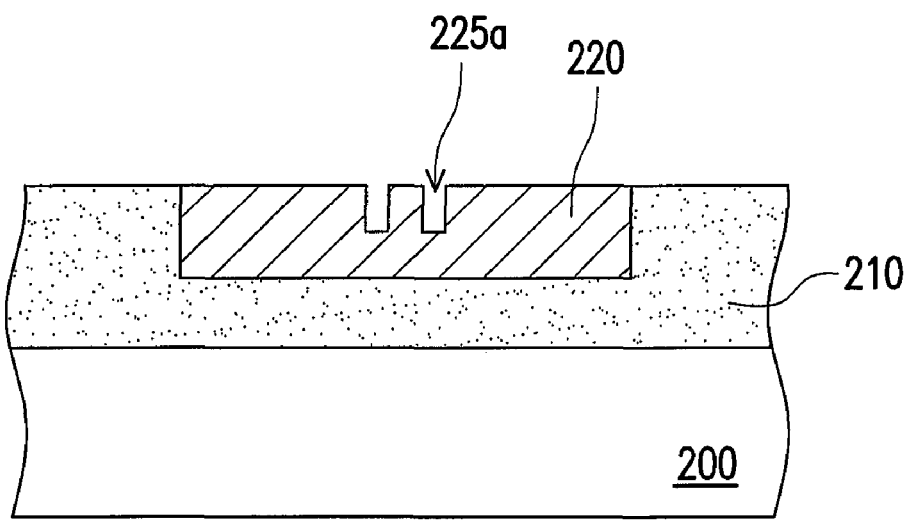

As shown in FIG. 3A, the method of manufacturing an integrated circuit structure in the present invention includes providing a dielectric layer 210 on a substrate 200. And an opening (not shown) is formed in the dielectric layer 210 and then the opening is filled with a conductive material such as copper, aluminum, tungsten, silver or an alloy of any combination of the above metals so as to form a conductive layer (not shown). In one embodiment, the conductive layer can be formed on the substrate 200 before forming the dielectric layer 210.

Thereafter, a photolithographic and etching process is used to remove a portion of the conductive layer so as to form a recess portion 225 in the conductive layer. Therefore, a conductive structure 220 having a recess portion 225 is formed. The external profile of the recess portion 225 and the conductive structure 220 may have a geometric pattern that looks, for example, circular, rectangular, elliptical or triangular, when views from the top. However, the geometric pattern of the recess portion 225 and the conductive structure 220 need not be identical. In another embodiment of the present invention, the recess portion 225a can also be formed as a ring-like pattern shown in FIG. 3A', exposing the inner lateral sidewall and the bottom of the conductive structure 220. It should be noted that, the recess portion 225a also may be adopted for the following steps of the present invention; therefore, only the recess portion 225 shown in FIG. 3A is presented as an exemplary example hereinafter.

Figure 3B:
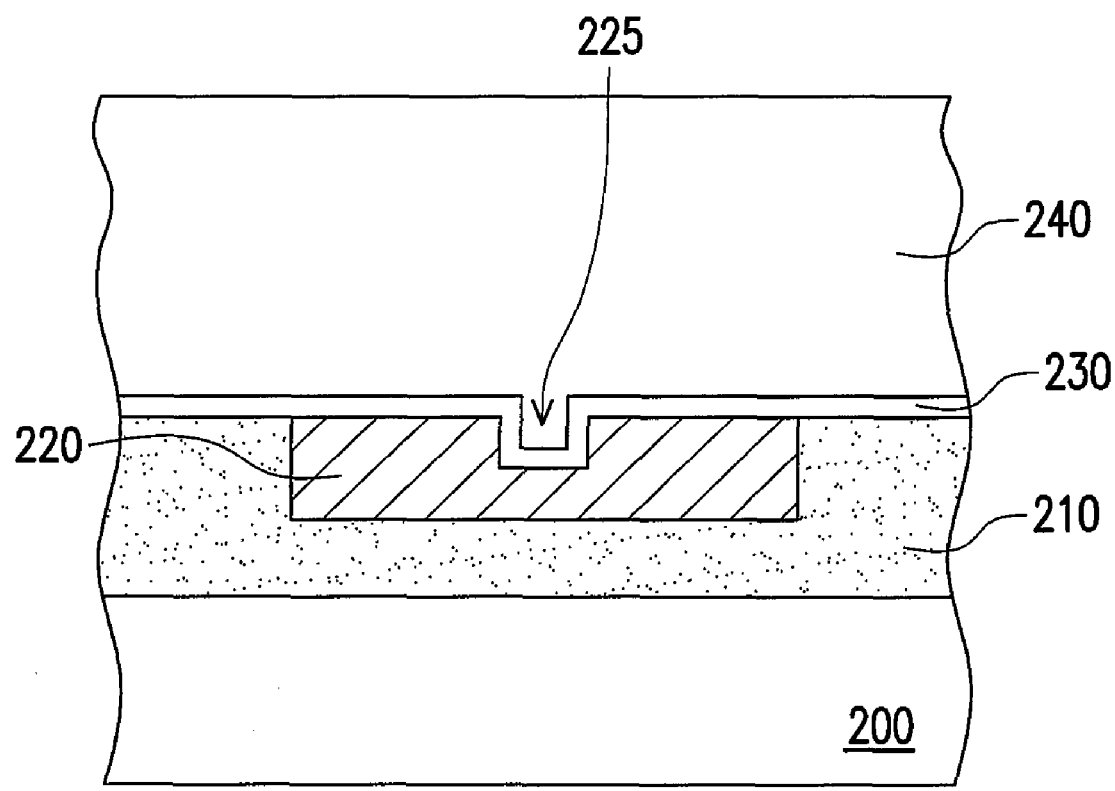

Next, as shown in FIG. 3B, an insulation layer 230 is selectively formed on the dielectric layer 210. Then, a low-k dielectric layer 240 is formed. The method and material for forming the insulation layer 230 and the low-k dielectric layer 240 are similar to the previous embodiment, and therefore, may refer to the previous embodiment.

Figure 3C:
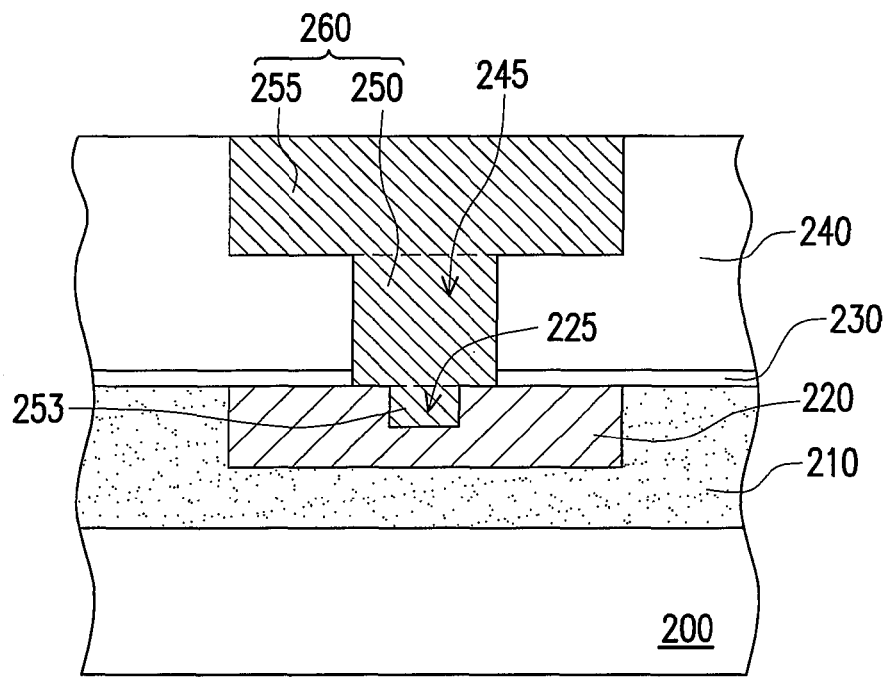

Thereafter as shown in FIG. 3C, a portion of the low-k dielectric layer 240 and the insulation layer 230 can be removed to form an opening 245 in the low-k dielectric layer 240. The opening 245 communicates with the recess portion 255 of the conductive structure 220 so as to expose a portion of the conductive structure 220. In the present embodiment, the opening 245 is, for example, a dual damascene opening with an upper portion of the opening 245 being a trench and a lower portion of the opening being a plug opening. In the etching process for forming the opening 245, an over-etching process is, for example, performed so as to remove the low-k dielectric layer 240 and the insulation layer 230 in the recess portion 225 and expose the sidewalls of the recess portion 225 of the conductive structure 220.

Again, as shown in FIG. 3C, a dual damascene structure 260 having a plug 250 and a conductive wire 255 is formed in the opening 245. A bonding portion 253 on the bottom of the plug is extended into the recess portion 225 and connected to the conductive structure 220. In one embodiment, the low-k dielectric layer 240 and the insulation layer 230 in the recess portion 225 are completely removed. Therefore, the bonding portion 253 is entirely formed within the recess portion 225 and exactly fitted into the recess portion 225.

In FIG. 3C, the lateral dimension D of the plug 250 is, for example, greater than the lateral dimension d of the recess portion 225. The bonding portion 253 not only has its external sidewalls connected to the conductive structure 220, the bottom of the bonding portion 253 is also in contact with the conductive structure 220 so that the plug 250 and the conductive structure 220 form a very tight connection. Accordingly, the adhesion between the insulation layer 230 220 and the low-k dielectric layer 240 above the conductive structure is enhanced and the probability of dielectric peeling is reduced.

Figure 3D:
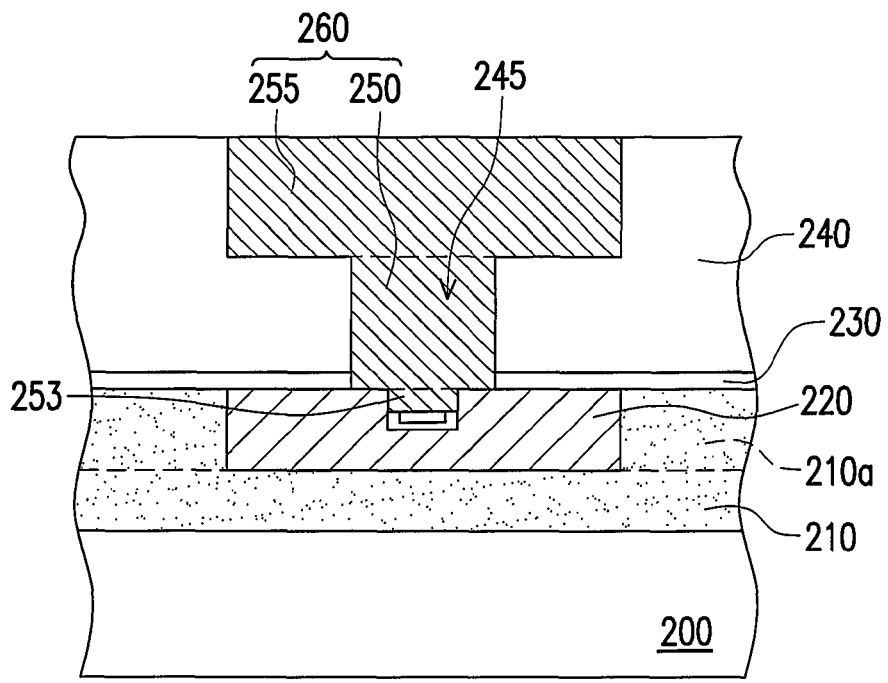

As shown in FIG. 3D, in another embodiment, residues of the low-k dielectric layer 240 or the insulation layer 230 may be retained at the bottom of the recess portion 225 in the step of forming the opening 245. However, as long as a protruding bonding portion 253 is still formed on the bottom of the plug 250 and connected to the conductive structure 220, the purpose of increasing the adhesion between the low-k dielectric layer 240 and the insulation layer 230 can be achieved.

It should be mentioned that, in one embodiment, the upper portion of the dielectric layer 210 can be a dielectric layer 210a composed of low-k dielectric material, as shown in FIG. 3D. The method of forming the dielectric layer 210a includes performing a chemical vapor deposition process or a spin-coating operation. The resistance in the interconnect is decreased due to the low-k character of the dielectric material. Since the material above and below the insulator layer 230 are both low-k dielectric material, by adopting the conductive structure 220 in the embodiment, the chance of peeling off between the dielectric layer can be reduced even more and the adhesion between these dielectric layer can be enhanced.

Obviously, the opening 245 can be misaligned or the lateral dimension of the plug 250 can be smaller or equal to the recess portion 125 so that the bonding portion 253 cannot entirely fit into the inner sidewall of the conductive structure 220. However, the adhesion between the low-k dielectric layer 140 and the insulation layer 130 can still be increased as long as the bonding portion 253 is connected to part of the conductive structure 220.

In the following, an integrated circuit structure according to an embodiment of the present invention is described.

As shown in FIGS. 1D and 2D, the integrated circuit structure includes a dielectric layer 110, a conductive structure 120, a low-k dielectric layer 140 and a plug 150. The dielectric layer 110 is disposed on a substrate 100. The material of the dielectric layer 110 includes dielectric material such as silicon oxide, BPSG, PSG and BSG. The dielectric layer 110 has a conductive portion (not shown) formed therein, for example. The substrate 100 is a semiconductor wafer and includes devices and film layers on the semiconductor wafer, for example. Furthermore, the substrate 100 may has a conductive portion (not shown) formed thereon. The subsequently formed conductive structure and plug can be electrically connected to the conductive portion of the dielectric layer 110 or the substrate 100 so as to form a complete circuit.

The conductive structure 120 is disposed in the dielectric layer 110 and has a recess portion 125, for example. In one embodiment, as shown in FIGS. 1D and 2D, the conductive structure 120 is a ring-like structure and the recess portion 125, for example, extends through the conductive structure 120 to form a hollow portion surrounded by the conductive structure 120. Of course, the recess portion 125 in the present invention is not limited in the pattern of hollow portion with tube-shape shown in FIGS. 1D and 2D. In another embodiment, the recess portion 125a can be a ring-like hollow portion as shown in FIGS. 1B' and 2B'.

The material of the conductive structure includes, for example, copper, aluminum, tungsten, silver or an alloy of any combination of the above metals. The external profile of the conductive structure 120 and the recess portion 125 can have a geometric pattern such as circular, elliptical, triangular, diamond or polygonal shape. Furthermore, the external profile of the conductive structure 120 and the external profile of the recess portion 125 (that is, external profile of the ring-like conductive structure 120) may not be identical and their profiles may be set according to the design of the device.

The low-k dielectric layer 140 is disposed on the dielectric layer 110. The material of the low-k dielectric layer 140 is, for example, an inorganic low-k material or an organic low-k material and includes, for example, carbon doped oxide (CDO) with porogen (main ingredient being $C_xH_y$, for example), hydrogenated amorphous carbon, fluorinated amorphous carbon, Parylene AF4, HSQ, PAE, Cyclotene, Silica aerogel, Silica xerogel, Flare, SILK, Parylene and so on. An insulation layer 130 can be disposed between the low-k dielectric layer 140 and the dielectric layer 110. The material of the insulation layer 130 is silicon oxide, for example.

The plug 150 is disposed in the low-k dielectric layer 140 and passes through the insulation layer 130. Furthermore, the bottom of the plug 150 has a protruding bonding portion 153. The bonding portion 153 is extended into the dielectric layer 110 and connected to the conductive structure 120. The plug 150 is part of a dual damascene structure 160 having a conductive wire 155 above, for example. The material of the plug 150 includes copper aluminum or an alloy containing copper or aluminum, for example.

In the present embodiment, the lateral dimension D of the plug 150 is greater than the lateral dimension d of the recess portion 153, for example. The recess portion 153 of the plug 150 is extended into the hollow recess portion 125 of the ring-like conductive structure 120. This makes the outer sidewall of the bonding portion 153 form a complete connection to the inner sidewall of the conductive structure 120, thereby substantially increasing the adhesion between the low-k dielectric layer 140 and the insulation layer 130.

Of course, the bonding portion 153 of the plug 150 need not latch onto the hollow portion 125 completely. As long as the bonding portion 153 on the bottom of the plug 150 is extended into the dielectric layer 110 and connected to the conductive structure 120, the purpose of increasing the adhesion between the low-k dielectric layer 140 and the insulation layer 130 can be achieved. When the adhesion between the low-k dielectric layer 140 and the insulation layer 130 is increased, dielectric peeling can be avoided. As a result, bridging between interconnects is minimized and dropping of particles onto the surface of the wafer is prevented. The elimination of the above problems has the benefits of increasing the product yield and improving the reliability and overall performance of the product.

In addition, the conductive structure is not limited to the aforementioned ring-like structure. In one embodiment, as shown in FIG. 3C, the recess portion 225 of the conductive structure 220 is located in the conductive structure 220, but does not pass through the conductive structure 220. Of course, the shape of the recess portion 225 is not limited to that of the FIG. 3C, in another embodiment shown in FIG. 3A', the recess portion 225a can also be a ring-like shape. The outer sidewall and bottom sidewall of the bonding portion 253 of the plug 250 forms a tight latching with the recess portion 225. This tight connection is capable of increasing the adhesion between the insulation above the conductive structure 220 and the low-k dielectric layer and achieves the aforementioned desirable functions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated circuit structure, comprising:
a dielectric layer;
a conductive structure, disposed in the dielectric layer and having a recess portion;
a low-k dielectric layer, disposed on the dielectric layer;
a dual damascene structure having a wire and a plug, disposed in the low-k dielectric layer; and
a protruding bonding portion connected to the bottom of the plug, wherein the bonding portion is extended into the dielectric layer and connected to the recess portion of the conductive structure wherein the recess portion surrounds a portion of the conductive structure.

2. The integrated circuit structure according to claim 1, wherein the lateral dimension of the plug is greater than the lateral dimension of the recess portion.

3. The integrated circuit structure according to claim 1, wherein the bonding portion of the plug is extended into the recess portion of the conductive structure.

4. The integrated circuit structure according to claim 1, wherein the conductive structure is a ring-like structure and the recess portion extends through the conductive structure to form a hollow portion.

5. The integrated circuit structure according to claim 4, wherein the lateral dimension of the plug is greater than the lateral dimension of the hollow portion.

6. The integrated circuit structure according to claim 1, wherein material of the plug comprises copper, tungsten or an alloy of the two.

7. The integrated circuit structure according to claim 1, wherein material of the conductive structure comprises copper, aluminum or an alloy of the two.

8. The integrated circuit structure according to claim 1, further comprising an insulation layer disposed between the dielectric layer and the low-k dielectric layer.

9. A method of manufacturing an integrated circuit structure, comprising:
providing a dielectric layer;
forming a conductive structure in the dielectric layer, wherein the conductive structure has a recess portion;
forming a low-k dielectric layer on the dielectric layer and in the recess of the conductive structure;
forming an opening in the low-k dielectric layer, wherein the opening communicates with the recess portion of the conductive structure and exposes a portion of the conductive structure; and
forming a dual damascene structure having a wire and a plug in the opening, wherein a bonding portion on the bottom of the plug is extended into the recess portion and connected to the conductive structure wherein the plug directly contacts the conductive structure.

10. The method according to claim 9, wherein the lateral dimension of the plug is greater than the lateral dimension of the recess portion.

11. The method according to claim 9, wherein the bonding portion of the plug is extended into the recess portion of the conductive structure.

12. The method according to claim 9, wherein the conductive structure is a ring-like structure and the recess portion extends through the conductive structure to form a hollow portion.

13. The method according to claim 12, wherein a method of forming the conductive structure comprises:
forming a patterned photoresist layer on the dielectric layer;
using the patterned photoresist layer as a mask to form a ring-like opening;
removing the patterned photoresist layer; and
filling the ring-like opening with a conductive material.

14. The method according to claim 13, wherein the conductive material comprises copper or an alloy of copper.

15. The method according to claim 9, wherein a method of forming the conductive structure comprises:
forming a conductive layer in the dielectric layer; and
removing a portion of the conductive layer so as to form the recess portion on a surface of the conductive layer.

16. The method according to claim 9, further comprising forming an insulation layer on the dielectric layer after forming the conductive structure but before forming the low-k dielectric layer.

17. The method according to claim 9, wherein a method of forming the low-k dielectric layer comprises performing a spin-coating process.

* * * * *